United States Patent
Seetharaman et al.

(10) Patent No.: US 6,833,762 B2
(45) Date of Patent: Dec. 21, 2004

(54) TRANSIMPEDANCE AMPLIFIER

(75) Inventors: Shivakumar Seetharaman, Westlake Village, CA (US); Lawrence L. Huang, La Mirada, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/325,026

(22) Filed: Dec. 20, 2002

(65) Prior Publication Data

US 2004/0119541 A1 Jun. 24, 2004

(51) Int. Cl.[7] .................................................. H03F 3/08
(52) U.S. Cl. ...................... 330/308; 330/59; 250/214 A
(58) Field of Search ............... 330/59, 308; 250/214 A, 250/214 AG

(56) References Cited

U.S. PATENT DOCUMENTS

| | | |
|---|---|---|
| 4,218,613 A | 8/1980 | Bletz |
| 4,902,282 A | 2/1990 | Bellotti et al. |
| 5,430,766 A | 7/1995 | Ota et al. |
| 5,805,558 A | 9/1998 | Kimura |
| 5,892,609 A | 4/1999 | Saruwatari |
| 6,084,478 A * | 7/2000 | Mayampurath ............. 330/308 |
| 6,342,694 B1 * | 1/2002 | Satoh ...................... 250/214 A |
| 6,587,004 B2 * | 7/2003 | Ide .............................. 330/308 |
| 6,593,810 B2 | 7/2003 | Yoon |
| 2003/0219260 A1 | 11/2003 | Chiou et al. |

FOREIGN PATENT DOCUMENTS

JP  411-145913  5/1999

OTHER PUBLICATIONS

MacLeod, Iain D.G. "On the Bandwidth of Carrier–Type DC Amplifiers", IEEE Transactions on Circuit Theory, vol. CT–17, No. 3, Aug. 1970 (pp. 367–371).
U.S. Appl. No. 10/324,983 entitled "DC Offset Cancellation Circuit, System and Method", Inventor(s) Shivakumar Seetharaman, et al. (filed Dec. 20, 2002).
U.S. Appl. No. 10/324,999 entitled "Transimpedance Amplifier", Inventor(s) Shivakumar Seetharaman, et al. (filed Dec. 20, 2002).
U.S. Appl. No. 10/325,048 entitled "Transimpedance Amplifier", Inventor(s) Shivakumar Seetharaman, et al. (filed Dec. 20, 2002).
Provisional 60/371,288 (unable to obtain copy—expired provisional).
IEEE Std. 802.3ae—2002, clauses 46, 47 and 51–53.

* cited by examiner

*Primary Examiner*—Khanh Van Nguyen
(74) *Attorney, Agent, or Firm*—Blakely, Sokoloff, Taylor & Zafman LLP

(57) ABSTRACT

Disclosed is a transimpedance amplifier comprising a single ended input terminal to receive an input signal from a photodiode and differential output terminals. A circuit coupled between the single ended input terminal and a differential output terminal may vary the gain of the transimpedance amplifier in response to a DC current component of the input signal.

19 Claims, 5 Drawing Sheets

TRANSIMPEDANCE AMPIFIER

The subject matter disclosed herein relates to U.S. patent application Ser. No. 10/074,099, filed on Oct. 11, 2001, U.S. patent application Ser. No. 10/074,397, filed on Feb. 11, 2002, and U.S. patent application Ser. Nos. 10/324999, 10/324983, and Ser. No. 10/324048 filed on Dec. 20, 2002.

BACKGROUND

1. Field

The subject matter disclosed herein relates to data communication systems. In particular, embodiments disclosed herein relate to processing data received from an optical transmission medium.

2. Information

Optical communication networks have been implemented to enable increased data rates in links providing point to point communication. For example, optical communication links are typically implemented in Synchronous Optical Network/Synchronous Digital Hierarchy (SONET/SDH) and 10 Gigabit Ethernet systems. At a receiving end of such an optical communication link, a photodiode may generate a current in response an optical signal received from an optical transmission medium (e.g., fiber optical cabling). A transimpedance amplifier (TIA) typically converts the current generated by the photodiode into a voltage signal that is then processed. For example, the voltage signal may be processed by clock and data recovery circuitry to recover data transmitted in the optical signal.

BRIEF DESCRIPTION OF THE FIGURES

Non-limiting and non-exhaustive embodiments of the present invention will be described with reference to the following figures, wherein like reference numerals refer to like parts throughout the various figures unless otherwise specified.

DETAILED DESCRIPTION

Figure 1:
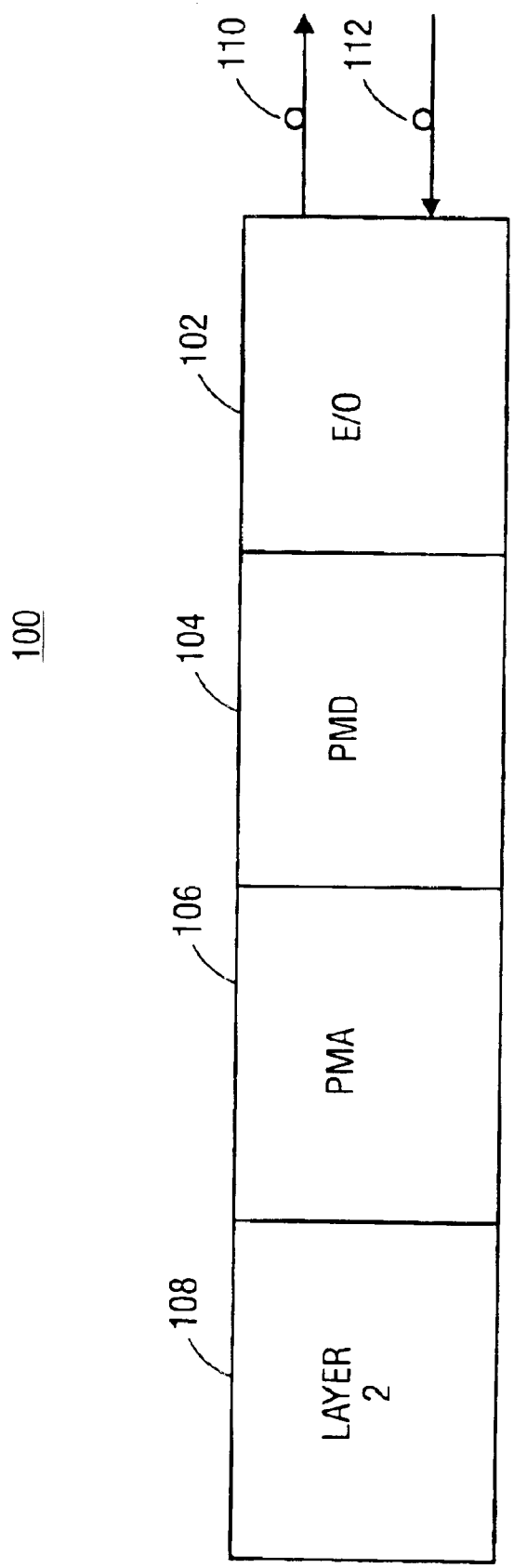
FIG. 1 shows a schematic diagram of a system to transmit data in and receive data from an optical transmission medium according to an embodiment of the present invention.

Reference throughout this specification to one embodiment or an embodiment means that a particular feature, structure, or characteristic described in connection with the embodiment is included in at least one embodiment of the present invention. Thus, the appearances of the phrase in one embodiment or an embodiment in various places throughout this specification are not necessarily all referring to the same embodiment. Furthermore, the particular features, structures, or characteristics may be combined in one or more embodiments.

A photodiode as referred to herein relates to a device that provides an output current in response to light energy collected on a surface. For example, a photodiode may provide an output voltage or an output current in response to charge collected at a photodiode gate. However, this is merely an example of a photodiode and embodiments of the present invention are not limited in these respects.

A transimpedance amplifier (TIA) as referred to herein relates to a device to convert an input current to an output voltage. For example, a TIA may convert an input current received from a photodiode to an output voltage that is substantially proportional to a magnitude of the input current. However, this is merely an example of a TIA and embodiments of the present invention are not limited in this respect.

A single-ended terminal as referred to herein relates to an electrical terminal to transmit or receive a single-ended signal. For example, single-ended terminal may receive a signal as an input signal. However, this is merely an example of a single-ended terminal and embodiments of the present invention are not limited in this respect.

Differential terminals as referred to herein relates to a pair of terminal that may receive or transmit a differential signal. For example, differential terminals signal may express a signal as a voltage difference between the terminals. However, this is merely an example of differential terminals and embodiments of the present invention are not limited in this respect.

DC current as referred to herein relates to a current component in an electrical signal that is substantially constant over a time period. For example, the current in a signal may comprise a DC current component combined with or added to an AC current component that fluctuates over a time period. However, this is merely an example of a DC current and embodiments of the present invention are not limited in these respects.

DC current detection circuit as referred to herein relates to a circuit that is capable of detecting a DC current component in a signal. For example, a DC current detection circuit may generate a signal that is representative of a magnitude of a DC current component in a signal. However, this is merely an example of a DC current detection circuit and embodiments of the present invention are not limited in this respect.

Briefly, an embodiment of the present invention relates to a transimpendance amplifier comprising differential output terminals and a single ended input terminal to receive an input signal from a photodiode. A circuit coupled between the single ended input terminal and a differential output terminal may vary a gain of the transimpedance amplifier in response to a DC current component in the input signal. However, this is merely an example embodiment and other embodiments of the present invention are not limited in these respects.

FIG. 1 shows a schematic diagram of a system to transmit in and receive data from an optical transmission medium according to an embodiment of the present invention. An optical transceiver 102 may transmit or receive optical signals 110 or 112 in an optical transmission medium such as fiber optic cabling. The optical transceiver 102 may modulate the transmitted signal 110 or demodulate the received signal 112 according to any optical data transmission format such as, for example, wave division multiplexing wavelength division multiplexing (WDM) or multi-amplitude signaling (MAS). For example, a transmitter portion (not shown) of the optical transceiver 102 may employ WDM for transmitting multiple lanes of data in the optical transmission medium.

A physical medium dependent (PMD) section 104 may provide circuitry, such as a TIA (not shown) and/or limiting amplifier (LIA) (not shown), to receive and condition an electrical signal from the optical transceiver 102 in response to the received optical signal 112. The PMD section 104 may also provide to a laser device (not shown) in the optical transceiver 102 power from a laser driver circuit (not shown) for transmitting an optical signal. A physical medium attachment (PMA) section 106 may include clock and data recovery circuitry (not shown) and de-multiplexing circuitry (not shown) to recover data from a conditioned signal received from the PMD section 104. The PMA section 106 may also comprise multiplexing circuitry (not shown) for transmitting data to the PMD section 104 in data lanes, and a serializer/deserializer (Serdes) for serializing a parallel data signal from a layer 2 section 108 and providing a parallel data signal to the layer 2 section 108 based upon a serial data signal provided by the clock and data recovery circuitry.

According to an embodiment, the layer 2 section 108 may comprise a media access control (MAC) device coupled to the PMA section 106 at a media independent interface (MII) as defined IEEE Std. 802.3ae-2002, clause 46. In other embodiments, the layer 2 section 108 may comprise forward error correction logic and a framer to transmit and receive data according to a version of the Synchronous Optical Network/Synchronous Digital Hierarchy (SONET/SDH) standard published by the International Telecommunications Union (ITU). However, these are merely examples of layer 2 devices that may provide a parallel data signal for transmission on an optical transmission medium, and embodiments of the present invention are not limited in these respects.

The layer 2 section 108 may also be coupled to any of several input/output (I/O) systems (not shown) for communication with other devices on a processing platform. Such an I/O system may include, for example, a multiplexed data bus coupled to a processing system or a multi-port switch fabric. The layer 2 section 108 may also be coupled to a multi-port switch fabric through a packet classification device. However, these are merely examples of an I/O system which may be coupled to a layer 2 device and embodiments of the present invention are not limited in these respects.

The layer 2 device 108 may also be coupled to the PMA section 106 by a backplane interface (not shown) over a printed circuit board. Such a backplane interface may comprise devices providing a 10 Gigabit Ethernet Attachment Unit Interface (XAUI) as provided in IEEE Std. 802.3ae-2002, clause 47. In other embodiments, such a backplane interface may comprise any one of several versions of the System Packet Interface (SPI) as defined by the Optical Internetworking Forum (OIF). However, these are merely examples of a backplane interface to couple a layer 2 device to a PMA section and embodiments of the present invention are not limited in these respects.

Figure 2:
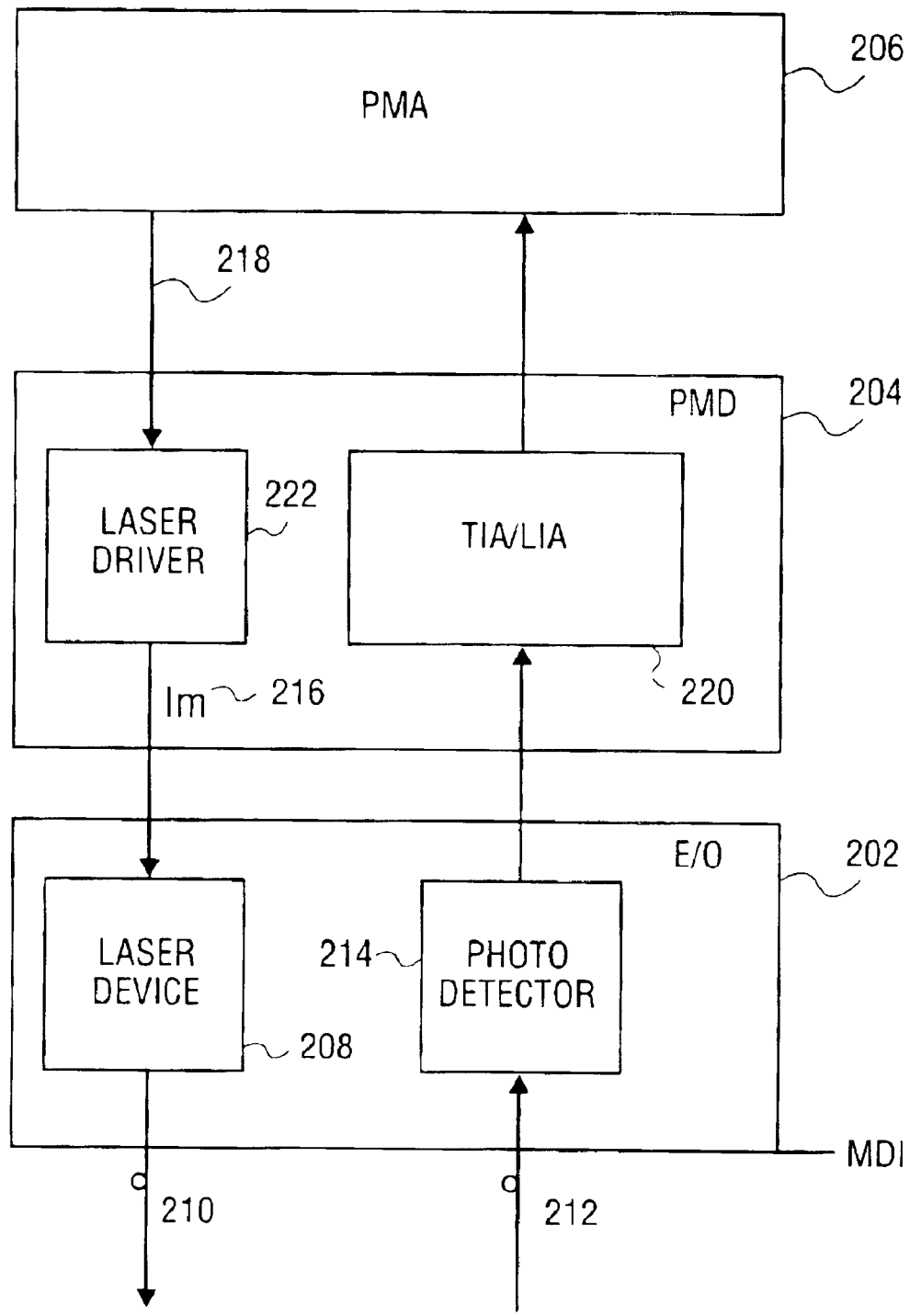
FIG. 2 shows a schematic diagram of physical medium attachment (PMA) and physical medium dependent (PMD) sections of a data transmission system according to an embodiment of the system shown in FIG. 2.

FIG. 2 shows a schematic diagram of a system 200 to transmit data in and receive data from an optical transmission medium according to an embodiment of the system shown in FIG. 2. An optical transceiver 202 comprises a laser device 208 to transmit an optical signal 210 in an optical transmission medium and a photo detector section 214 to receive an optical signal 212 from the optical transmission medium. The photo detector section 214 may comprise one or more photodiodes (not shown) for converting the received optical signal 212 to one or more electrical signals to be provided to a TIA/LIA circuit 220. A laser driver circuit 222 may modulate a modulation current 216 in response to a data signal from a PMA section 206. A laser device 208 may then modulate and power the transmitted optical signal 210 in response to the modulation current 216.

According to an embodiment, the LIA portion of the PMD section may provide a conditioned signal to clock and data recovery (CDR) circuitry (not shown) in the PMA section 206. The LIA portion and the CDR circuitry may be designed to process signals over a particular dynamic range to enhance or reduce the bit error rate (BER) in the recovered data. Such a dynamic range may be set as a system design parameter such that the signal provided to the CDR circuitry has sufficient signal-to-noise ratio while accounting for saturation of detection circuitry for data signals approaching the upper and lower regions of the dynamic range.

On the other hand, a photodiode in the photodetector 214 may be designed to provide an output current that is specified according to system parameters set forth in a particular one of various standards such as SONET/SDH and different Ethernet standards (e.g., for local area networks (LANs), wide area networks (WANs) and metropolitan area networks (MANs)). For example, the photodiode in the photodetector 214 may be designed to provide an output current at a set dynamic range as provided in a standard defined parameter that is specific to a particular standard. According to an embodiment, the TIA/LIA section 220 may be designed to provide an output to CDR circuitry in the PMA section 202 at a dynamic range according to a system design parameter in response to a current from the photodetector 214 provided at any one of several dynamic ranges (e.g., as provided in a particular standard).

Figure 3:
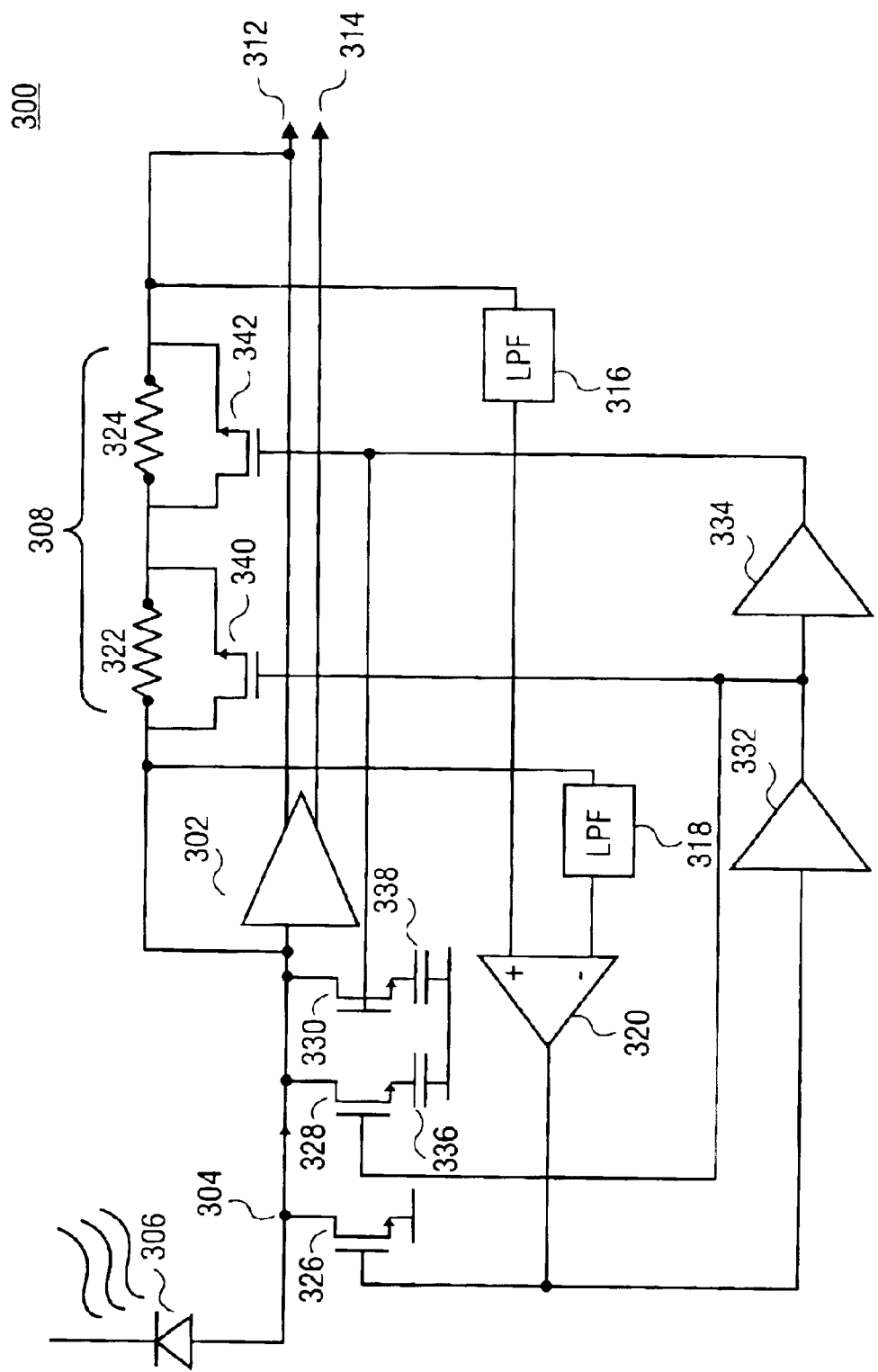
FIG. 3 shows a schematic diagram of a transimpedance amplifier (TIA) according to an embodiment of the PMD section shown in FIG. 2.

FIG. 3 shows a schematic diagram of a transimpedance amplifier (TIA) 300 according to an embodiment of the PMD section shown in FIG. 2. An amplifier 302 receives a signal at a single-ended input terminal 304 from a photodiode 306 which is responsive to an optical data signal and provides a differential voltage signal at differential output terminals 312 and 314. The TIA 300 may be formed as part of an integrated device (e.g., as part of a single device including the TIA 300 and other portions of the PMD section) in a semiconductor process such as a complementary metal oxide semiconductor (CMOS) manufacturing process. However, this is merely an example of a process that may be used to form a TIA and embodiments of the present invention are not limited in this respect.

Figure 4:
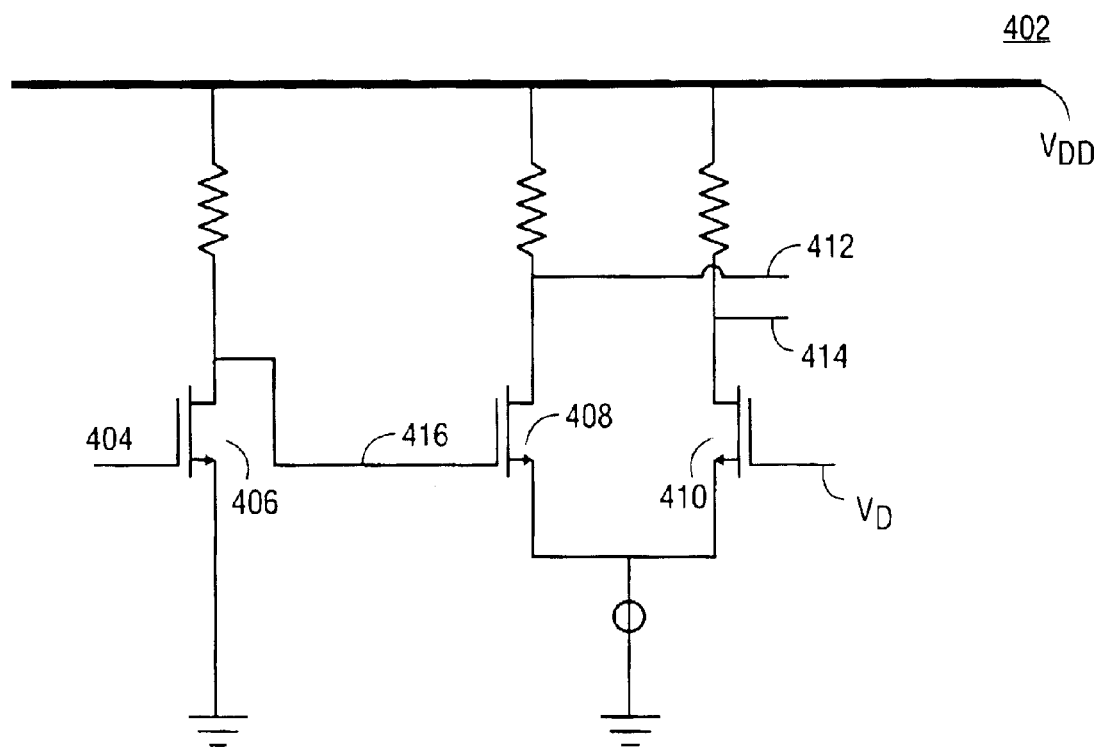
FIG. 4 shows a schematic diagram of a multistage amplifier according to an embodiment of the TIA shown in FIG. 3.

FIG. 4 shows a schematic diagram of a multistage amplifier 402 according to an embodiment of the amplifier 302 shown in FIG. 3. A first amplification stage comprises a transistor 406. A gate of the transistor 406 may receive a single ended input signal on a single-ended input terminal 404 from the photodiode 306. In response to the input signal, a second amplification stage comprising a differential amplifier formed by transistors 408 and 410 provides an output voltage on differential output terminals 412 and 414. However, this is merely an example of an amplifier that may be used in a TIA to receive a single ended input signal and provide a differential output signal, and embodiments of the present invention are not limited in this respect.

According to an embodiment, the TIA 300 may provide an output voltage at the output terminals in response to an input current received at the single-ended input 304 according to a signal gain. The output terminal 312 may be coupled to the single ended input terminal 304 through a resistance section 308. According to an embodiment, increasing the resistance 308 in the feedback circuit may increase the signal gain of the TIA 300 while decreasing the resistance 308 may decrease the signal gain.

Figure 5:
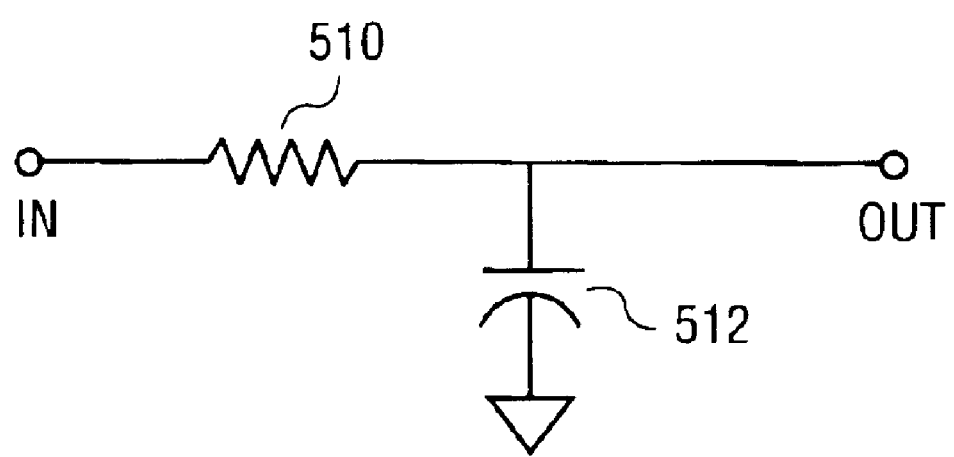
FIG. 5 shows a schematic diagram of a low pass filter circuit according to an embodiment of the TIA shown in FIG. 3.

According to an embodiment, a DC current detection circuit may detect a DC component of the input signal provided by the photodiode 306. An input voltage $V_{in}$ at the single-ended input terminal 304 is substantially proportional to an output voltage $V_{out}$ at an output terminal 312. A voltage across the resistance 308 is substantially proportional to the magnitude of the current provided at the single-ended input 304. As such, the voltage across the resistance 308 may have a DC component and an AC component that are substantially proportional to the magnitudes of respective DC and AC components of the current at the input single on ended input terminal 304. Voltages at the terminals of the resistor 308 are provided to low pass filters (LPFs) 316 and 318 to substantially remove the AC component of the voltage across the resistor 308. Accordingly, the voltage between the outputs of the LPFs 316 and 318 may be substantially proportional to the DC component in the voltage across the resistance 308. According to an embodiment, the LPFs 316 and 318 may be any LPF formed using a resistor 510 and capacitor 512 as shown in FIG. 5. However, this is merely an example of how a LPF may be formed in a circuit and embodiments of the present invention are not limited in these respects.

The outputs of the LPFs 316 and 318 may each be provided to a corresponding input terminal of an operational amplifier 320. According to an embodiment, the magnitude of the output of the operational amplifier 320 may be representative of the magnitude of the DC current component in the input signal received at the single-ended input terminal 304. Buffer circuits 332 and 334 may control bypass transistors 340 and 342 (coupled across respective resistors 322 and 324) to vary the magnitude of resistance 308 in response to the output of operational amplifier 320. In the illustrated embodiment, the bypass transistors 340 and 342 may decrease the resistance 308 as a function of the magnitude of the DC current component in the input signal received at the single-ended input terminal 304. The bypass transistors 340 and 342 may similarly increase the resistance 308 as a function of the magnitude of the DC current component.

By varying the resistance 308 in response to the magnitude of the DC current component, the gain of the TIA 300 may be varied in that increases in the resistance 308 may increase the gain of the TIA 300 while decreases in the resistance 308 may decrease the gain of the TIA 300. Accordingly, the gain of the TIA 300 may be set as a decreasing function of the magnitude of the DC current component in the input signal provided to the single-ended input 304.

According to an embodiment, the gain of the TIA 300 may be adjusted to maintain a dynamic range of the output signal (at differential output terminals 312 and 314) to meet system parameters defined for upstream processing circuitry (e.g., CDR circuitry). Accordingly, the TIA 300 may be adjusted for different requirements relating to LANs, WANs and MANs. Using techniques known to those of ordinary skill in the art of analog circuit design, the resistances of resistors 322 and 324, gain of operational amplifier 320 and size of transistors 340 and 342 may be selected to maintain the dynamic range to within the system parameters based upon the strength of the DC current component of the input signal on the single-ended input terminal 304.

According to an embodiment, an input capacitance at the single-ended input terminal 304 may also be varied in response to changes in the gain of the TIA 300 (in response to detection of the DC current component in the input signal provided to single-ended input terminal 304). Transistors 328 and 330, coupling respective capacitors 336 and 338 to the single-ended input terminal 304, may control the input capacitance in response to the outputs of buffer circuits 332 and 334. Increases in the input capacitance may maintain a phase margin that prevents or inhibits oscillation of the TIA 300. However, this is merely an example of how an input capacitance may be varied to maintain a phase margin, and embodiments of the present invention are not limited in these respects.

According to an embodiment, a sink transistor 326 may remove substantially all or a portion of the DC current component from the input signal at the single-ended input terminal 304. As pointed out above, the output voltage of the operational amplifier 320 may be substantially proportional to the DC current component of the input signal provided to the single-ended input terminal 304. Accordingly, in response to the output voltage of the operational amplifier 320 applied to a gate of the sink transistor 326, the sink transistor 326 may remove at least a portion of the DC current component from the input signal. Using techniques known to those of ordinary skill in the art of analog circuit design, the gain of operational amplifier 320 and size of transistor 326 may be selected such that current removed from the single-ended input 304 by the transistor 326 substantially removes the DC component of current at the single-ended input 304.

It should be understood that while the sink transistor 326 may remove substantially all or a portion of the DC current component of the input signal, the outputs of the buffer circuits 332 and 334 may still control the gain and phase margin of the TIA 300 in response to detecting the DC current component of the input signal. According to an embodiment, prior to removal of the DC current component by the sink transistor 326 the buffer circuits 332 and 334 may receive a voltage from the output of the operational amplifier 320 which is representative of the DC current component of the input signal. It should be appreciated that the voltage across resistance 308 should be maintained about constant as the DC current component received at the single-ended input terminal 304 is about constant. The voltage across resistance 308 may change in response to changes in the DC current component received at the single-ended input terminal 304, causing a change in an amount of current drawn from the single-ended input terminal 304 by sink transistor 326.

By substantially removing the DC current component at the single-ended input 304, downstream processing may more accurately recover data received from the photodiode 306. For example, removing the DC current component may better align an amplitude of an eye pattern signal to be processed by clock and data recovery circuitry in a PMA device, resulting in a reduced bit error rate.

While there has been illustrated and described what are presently considered to be example embodiments of the present invention, it will be understood by those skilled in the art that various other modifications may be made, and equivalents may be substituted, without departing from the true scope of the invention. Additionally, many modifications may be made to adapt a particular situation to the teachings of the present invention without departing from the central inventive concept described herein. Therefore, it is intended that the present invention not be limited to the particular embodiments disclosed, but that the invention include all embodiments falling within the scope of the appended claims.

What is claimed is:

1. A transimpedance amplifier comprising:
    a single ended input terminal to receive an input signal from a photodiode;
    one or more output terminals;
    a resistance comprising a plurality of series coupled resistors coupled between the single ended input terminal and one of said output terminals, each resistor having a component resistance;
    a DC current detection circuit to detect a DC current component in the input signal; and
    a circuit to vary the component resistance across one or more of said plurality of series coupled resistors in response to the detected DC current component.

2. The transimpedance amplifier of claim 1, wherein the transimpedance amplifier further comprises a circuit to vary an input capacitance at the single ended input terminal in response to the detected DC current component.

3. The transimpedance amplifier of claim 1, wherein the DC current detection circuit comprises
    a circuit to detect a DC voltage across the resistance.

4. The transimpedance amplifier of claim 1, wherein the transimpedance amplifier further comprises a DC current removal circuit coupled to the single ended input terminal to substantially remove the DC current component.

5. The transimpedance amplifier of claim 4, wherein the DC current removal circuit comprises a current sink transistor coupled to the single ended input terminal to remove a current in response to the detected DC component.

6. A system comprising:
    a photodiode;
    a transimpedance amplifier coupled to the photodiode to provide a differential output signal;
    a data recovery circuit to provide a serial data signal in response to the differential output signal; and
    a deserializer to provide a parallel data signal in response to the serial data signal, wherein the transimpedance amplifier comprises:
    a single ended input terminal to receive an input signal from the photodiode;
    one or more output terminals;
    a resistance comprising a plurality of series coupled resistors coupled between the single ended input terminal and one of said output terminals, each resistor having a component resistance;
    a DC current detection circuit to detect a DC current component in the input signal; and
    a circuit to selectively vary the component resistance across one or more of said plurality of series coupled resistors in response to the detected DC current component.

7. The system of claim 6, the system further comprising a SONET framer to receive the parallel data signal.

8. The system of claim 7, wherein the system further comprises a switch fabric coupled to the SONET framer.

9. The system of claim 6, the system further comprising an Ethernet MAC to receive the parallel data signal at a media independent interface.

10. The system of claim 9, wherein the system further comprises a multiplexed data bus coupled to the Ethernet MAC.

11. The system of claim 9, wherein the system further comprises a switch fabric coupled to the Ethernet MAC.

12. The system of claim 6, wherein the transimpedance amplifier further comprises a circuit to vary an input capacitance at the single ended input terminal in response to the detected DC current component.

13. The system of claim 6, wherein the DC current detection circuit comprises
    a circuit to detect a DC voltage across the resistance.

14. The system of claim 6, wherein the transimpedance amplifier further comprises a DC current removal circuit coupled to the single ended input terminal to substantially remove the DC current component.

15. The system of claim 14, wherein the DC current removal circuit comprises a current sink transistor coupled to the single ended input terminal to remove a current in response to the detected DC component.

16. A method comprising:
    receiving an input signal from a photodiode at a single-ended input terminal of a transimpedance amplifier;
    transmitting an output signal from one or more terminals of the transimpedance amplifier;
    detecting a DC current component in the input signal; and
    varying one or more component resistances of a plurality of series coupled resistors coupled between the input terminal in response to the detected DC current component.

17. The method of claim 16, the method further comprising varying an input capacitance at the single ended input terminal in response to the detected DC current component.

18. The method of claim 16, wherein detecting the DC current component in the input signal further comprises:
    measuring a DC voltage across the plurality of series coupled resistors; and
    generating a voltage representative of the DC current component in response to the DC voltage across the of series coupled resistors.

19. The method of claim 16, the method further comprising removing at least a portion of the DC current component from the single-ended input terminal.

* * * * *